US006992288B2

(12) United States Patent
Cafri et al.

(10) Patent No.: US 6,992,288 B2
(45) Date of Patent: Jan. 31, 2006

(54) APPARATUS AND METHOD FOR DIRECTING GAS TOWARDS A SPECIMEN

(75) Inventors: Hagay Cafri, Nes-Ziona (IL); Eitan Pinhasi, Bnei-Brak (IL)

(73) Assignee: Applied Materials, Israel, Ltd., Rehovot (IL)

( * ) Notice: Subject to any disclaimer, the term of this patent is extended or adjusted under 35 U.S.C. 154(b) by 84 days.

(21) Appl. No.: 10/799,145

(22) Filed: Mar. 12, 2004

(65) Prior Publication Data

US 2005/0199806 A1 Sep. 15, 2005

(51) Int. Cl.
*H01J 37/305* (2006.01)

(52) U.S. Cl. ...................... 250/307; 250/306; 250/309; 250/492.21

(58) Field of Classification Search ................ 250/307, 250/492.21, 309
See application file for complete search history.

(56) References Cited

U.S. PATENT DOCUMENTS 5,270,552 A * 12/1993 Ohnishi et al. ............. 250/307
5,358,806 A * 10/1994 Haraichi et al. ............... 430/5
5,851,413 A * 12/1998 Casella et al. ................ 216/92
6,770,867 B2 * 8/2004 Lezec et al. ............. 250/252.1
6,838,380 B2 * 1/2005 Bassom et al. ............. 438/680
2002/0102861 A1 * 8/2002 Bassom et al. ............. 438/766
2005/0103746 A1 * 5/2005 Nadeau et al. ................ 216/62

* cited by examiner

*Primary Examiner*—Nikita Wells
*Assistant Examiner*—Johnnie L Smith, II
(74) *Attorney, Agent, or Firm*—Tarek N. Fahmi

(57) ABSTRACT

The invention provides an apparatus and a method for directing gas towards a specimen, said apparatus includes: (i) means for directing a beam of charged particles towards the specimen; and (ii) a gas conduit providing gas to an area of incidence of said beam of charged particles onto said specimen. The gas conduit includes an intermediate portion having a first end for receiving the inert gas and a substantially sealed second end. The intermediate portion has a first and second apertures that are positioned such as to define a space through which the beam of charged particles can propagate. The intermediate portion is shaped such as to allow a first portion of the inert gas to exit the second aperture and to allow a second portion of the gas to propagate towards the second end and to be returned through the second aperture.

35 Claims, 7 Drawing Sheets

10

200

APPARATUS AND METHOD FOR DIRECTING GAS TOWARDS A SPECIMEN

FIELD OF THE INVENTION

The present invention relates to apparatuses and methods for directing gas towards a specimen and especially to apparatus and methods in which the gas interacts with a beam of charged particles.

BACKGROUND OF THE INVENTION

Scanning electron microscopes (SEMs) are known in the art. Typical prior art SEMs include at least one detectors for providing SEM images. U.S. Pat. No. 5,659,172 of Wagner describes a method for reliable defect detection using multiple perspective SEM images.

A SEM usually includes an electron gun for generating an electron beam, a SEM lens system for focusing and converging the electron beam, a deflection coil for deflecting the electron beam, a detector for detecting electrons, such as secondary emitted electron or reflected electrons that are emitted/ reflected from an inspected object and a processor that is operative to construct SEM images in response to detection signals provided from the detector.

Focused ion beam (FIB) systems are known in the art. FIB systems are generally utilized to perform die milling and cross sectioning. The milled or cross sectioned die is usually analyzed to detect defects. FIB systems can also be utilized to generate FIB images.

FIB systems usually include an ion source for generating an ion beam, a FIB lens system for focusing the ion beam to provide a focused ion beam and an ion beam deflector for deflecting the focused ion beam. Typically, a broad ion beam is utilized for an initial milling step, while a narrower ion beam is utilized for a successive step of polishing the walls of the cross sectioned wafer.

A FIB system that is operative to generate a FIB image also has a detector and a processor. Usually, the ion source, the FIB lens system and the ion beam deflector are located within a column that is commonly referred to as FIB column. The detector can also be placed within the FIB column.

There are various prior art systems that include both SEM columns and FIB columns, one being the SEMVision G2 of Applied Materials, Inc. of Santa Clara Calif.

FIB milling, SEM milling usually include injecting gas that interacts with the beam of charged particles (ions in the case of FIB, electrons in the case of SEM). The interaction accelerates and in some cases even facilitates the milling.

Gas may also be injected in order to reduce charging effects that may deteriorate a SEM image.

Gas is injected by a gas conduit that is made of a conductive material. The gas conduit usually effects the trajectory of the beam of charged particles. This phenomenon is also known as interaction with the electrons optic. Said phenomenon may result from the presence of a nozzle at one side of the beam, but not at the other side and may result from temporary charging of the gas conduit by charged particles that are scattered/ returned from the specimen.

U.S Pat. No. 6,555,815 of Feuetbaum et al. titled "Apparatus and method for examining specimen with a charged particle beam" provides an apparatus for examining a specimen with a beam of charged particles, where charging of the specimen is avoided or reduced by injecting inert gas onto the sample's surface. In order to avoid interactions with the electron optics, various embodiments are disclosed for providing a rotationally symmetrical nozzles and/or electrodes. Additionally, embodiments are disclosed wherein a plurality of gas conduits are arranged in a rotationally symmetrical manner. Alternatively, the conduit is incorporated into an element of the electron optics, such as the magnetic lens. Also, in order to reduce or eliminate interaction of the electrons with the gas molecules, embodiments are disclosed wherein the gas is pulsated, rather than continually injected.

There is a further need to provide efficient apparatuses and methods for providing gas to a specimen.

SUMMARY OF THE INVENTION

The invention an system for directing gas towards a specimen, said system includes: (i) means for directing a beam of charged particles towards the specimen; and (ii) a gas conduit providing gas to an area of incidence of said beam of charged particles onto said specimen. The gas conduit includes an intermediate portion having a first end for receiving the inert gas and a substantially sealed second end. The intermediate portion has a first aperture and a second aperture that are positioned such as to define a space through which the beam of charged particles can propagate. The intermediate portion is shaped such as to allow a first portion of the inert gas to exit the second aperture and to allow a second portion of the gas to propagate towards the second end and to be returned through the second aperture.

According to various embodiments of the invention the first portion and the second portion of the gas exit the second aperture at substantially opposite directions, said portions may form a symmetrical gas distribution pattern in relation to an optical axis of the beam of charged particles.

According to an embodiment of the invention the gas conduit generates a substantially rotational symmetrical magnetic field at the vicinity of the apertures.

According to an embodiment of the invention the intermediate portion is U-shaped or saddle shaped.

According to an embodiment of the invention the first and second apertures are positioned at substantially a middle of the intermediate portion.

According to an embodiment of the invention the second aperture is larger than the first aperture.

According to an embodiment of the invention the first and second apertures have substantially symmetrical shapes.

According to an embodiment of the invention the intermediate portion is shaped such as to prevent substantial beam deflection due to charging of the intermediate portion from interactions with charged particles returning from the specimen.

According to an embodiment of the invention the intermediate portion has a substantially symmetrical portion that defines the apertures. Conveniently, the substantial symmetrical portion is sized and positioned such as to interact with most of the charged particles returning from the specimen, it may be at least lmm long. According to an embodiment of the invention the first portion of gas is directed towards the substrate at a first angle that is slightly smaller than ninety degrees and whereas the second portion of gas is directed towards the substrate at a second angle that is slightly larger than ninety degrees. Conveniently, the first angle ranges between 60–89 degrees and wherein the second angle ranges between 91 and 120 degrees.

The invention provides an apparatus for directing gas towards a specimen, said apparatus includes: (i) a first gas conduit portion oriented at a first positive angle in relation to an imaginary line the is perpendicular to the central gas conduit portion; (ii) a second gas conduit portion oriented at a second negative angle in relation to the imaginary line; (iii) a central gas conduit portion,. coupled to the first and second gas conduit portions, the central gas conduit portion defines an first aperture and a second aperture. The central gas conduit portion is shaped such as to allow gas to exit via the second aperture at multiple directions towards the specimen. The first and second apertures define a passage that may be parallel to the imaginary axis. The central gas conduit is shaped such as to induce a substantially rotationally symmetrical magnetic field at a vicinity of the space.

According to an embodiment of the invention whereas the passage is shaped such as to allow the passage of a beam of charged particle beam. Conveniently, the passage is parallel to an expected path of a beam of charged particles that is directed towards the substrate.

According to an embodiment of the invention, the second gas conduit portion receives gas from the central gas conduit portion and returns at least a portion of said received gas to the central gas conduit portion.

According to an embodiment of the invention the second gas conduit portion receives gas from the means for providing gas.

According to an embodiment of the invention the central gas conduit portion generates a substantially rotational symmetrical magnetic field at the vicinity of the apertures.

The invention provides a method of directing gas towards a specimen, the method includes the stages of: (i) receiving gas at a gas conduit that defines at least one aperture shaped such as to allow gas to exit and a beam of charged particle to propagate; (ii) directing the gas towards the specimen at a positive direction and at a negative direction in relation to an imaginary axis that is perpendicular to an aperture out of the at least one apertures; and (iii) maintaining a substantially symmetrical magnetic filed while receiving charged particles from the specimen.

According to an embodiment of the invention, the method further includes interacting at least a portion of the gas with a beam of charged particles directed toward the specimen. Conveniently, the interaction results in milling the specimen or imaging the specimen. The charged particles can be ions or electrons.

According to various embodiments of the invention the stage of directing the gas may either overlap, partially overlap or not overlap with a stage of directing a beam of charged particles towards the specimen.

According to an embodiment of the invention the stage of directing includes directing received gas towards a second aperture; whereas a first portion of the gas exits via the second aperture while another portion propagates through a portion of the gas conduit to be retuned to the second aperture.

BRIEF DESCRIPTION OF THE DRAWINGS

The present invention will be more fully understood from the following detailed description of the embodiments thereof, taken together with the drawings in which:

FIGS. 4–7 illustrate various views of a gas nozzle configured in accordance with an embodiment of the present invention and having a heat sink.

DETAILED DESCRIPTION OF THE DRAWINGS

For simplicity of explanation it is assumed that the beam of charged particles is an electron beam that is directed towards a specimen. It is noted that the invention also applies to other beams of charged particles, such as but not limited to ion beams.

Figure 1:
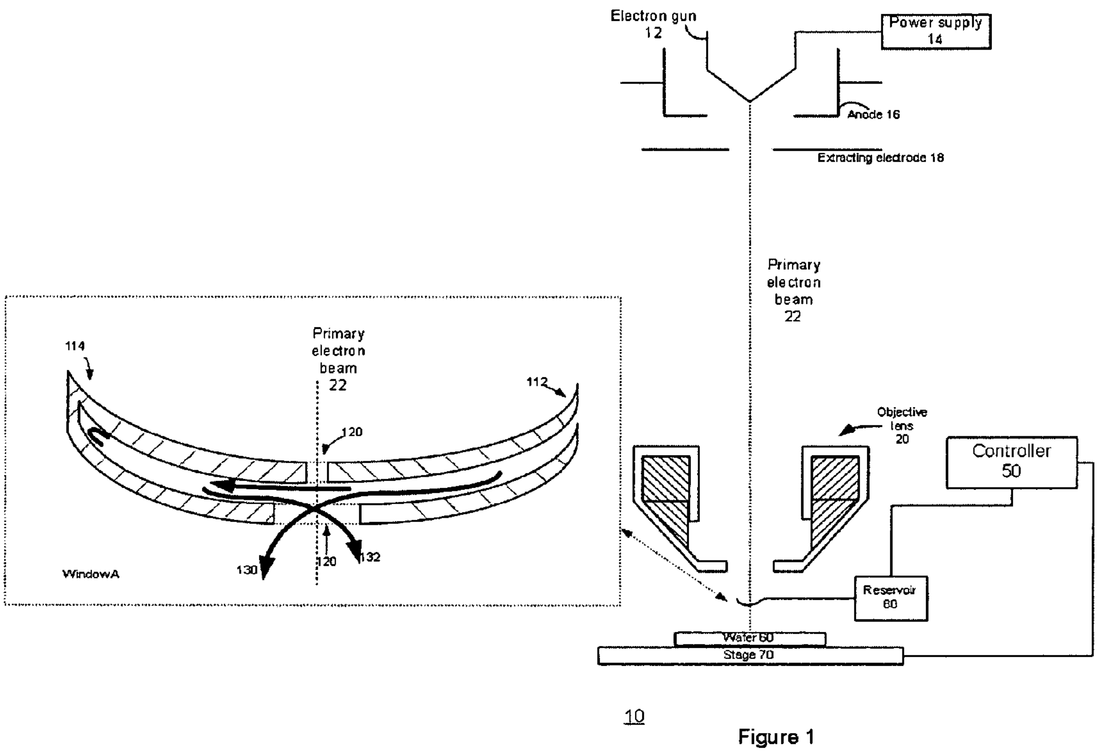
FIG. 1 is a schematic illustrations of a system for providing gas, in accordance to an embodiment of the invention.

FIG. 1 illustrates some parts of system 10 for directing gas towards a specimen. System 10 is capable of directing and even generating a beam of electrons and to direct it towards a certain point of a specimen. System 10 may be a scanning electron microscope or may form a part of such a microscope.

There are various well-known prior art techniques and means for generating and directing an electron beam. These means usually include an electron gun as well as high voltage power supply units, electron optics and the like. The electron optics usually includes at least one objective lens and at least one electron and/or anode.

The specimen is obtained within a sealed chamber that is kept at a certain vacuum level. The electron gun and other electron optic components are usually maintained at a higher vacuum level.

System 10 includes multiple components some are illustrated in FIG. 1. These components include an electron gun 12 as well as an anode 16 and extracting electrode 18 for generating a primary electron beam 22. System 10 also includes electron optics such as objective lens 20 and may also include additional electron optics such as an electrostatic lens, deflection coils and the like. Some components and optional components that are included with system 10, such as sensors, are not illustrated for simplicity of explanation.

The objective lens 20 is followed by gas conduit 100 that is connected to a gas source, such as a gas reservoir 80 that is adapted to provide gas in response to a control signal provided by a controller 50. It is noted that the gas conduit 100 may be connected to multiple devices for providing different gases. This multi-gas connectivity may be useful when a first gas is injected for a certain purpose (for example accelerating milling or construction) while another is injected fro another purpose (for example for reducing charging effects). The gas may be provided at various times, in relation to the timing of the electron beam generation.

Figure 2:
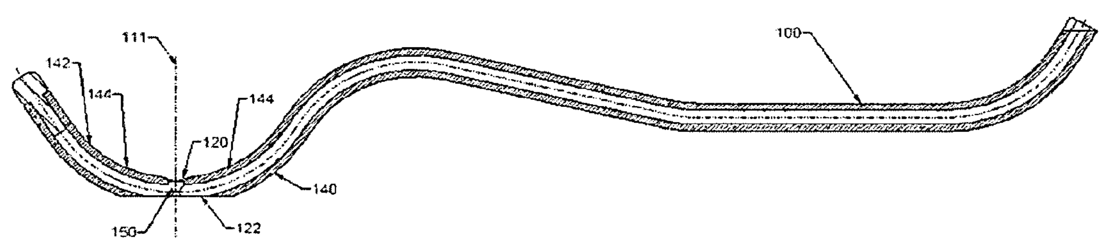
FIGS. 2 and 4–7 are schematic illustration of apparatuses for providing gas, according to various aspects of the invention.

The gas conduit 100 includes various portions one of said portions (intermediate portion 110) is illustrated in greater details in window A of FIG. 1 while some portions are further illustrated in FIG. 2.

Intermediate portion 110 has a first end 112 for receiving the inert gas and a substantially sealed second end 114. The intermediate portion 110 has an first and second apertures 120 and 122 that are positioned such as to define a space through which the primary electron beam 22 can propagate. The intermediate portion 110 is shaped such as to allow a first portion of the inert gas 130 to exit the second aperture 122 and to allow a second portion of the gas 132 to propagate towards the second end and to be returned through the second aperture 122. The first aperture 120 is smaller than the second aperture 122 as most of the gas should exit through the second aperture 122.

According to various aspects of the invention the first portion 130 and the second portion 132 of the gas exit the second aperture at substantially opposite directions. They may even form a symmetrical gas distribution pattern in relation to an optical axis of the primary electron beam 22.

According to an embodiment of the invention the two gas portions that are oriented at a positive and negative angles in relation of the primary electron beam 22 may interact with both sides of a structure formed on the wafer 60.

According to an aspect of the invention the gas conduit 100 generates a substantially rotational symmetrical magnetic field at the vicinity of apertures 120 and 122, thus the primary electron beam 22 is not deflected due to charging of the gas conduit 100. The gas conduit may be temporarily charged as a result of interactions with electrons, such as secondary electrons, backscattered electrons, and the like that are emitted from wafer 60. The rotational symmetrical magnetic field may achieved by at least one of the following: providing a symmetrical intermediate portion 100, providing a symmetrical apertures 120 and 122. It is noted that the size of the symmetrical portion of the gas conduit may be determined in response to an estimated charging due to said emitted electrons. Accordingly, the intermediate portion 100 may be long enough to absorb most of the emitted electrons, and may also be positioned at a relatively small distance from the wafer 60 such as to allow a relatively concise intermediate portion 110.

FIGS. 1 and 2, 4,5,6, and 7 illustrate a U shaped or saddle shaped gas conduit, but other shapes may provide the required gas distribution.

According to various embodiments of the invention the shape of the gas conduit 100 and especially the shape of the intermediate portion 110 shall allow to allow the gas portions at small angles in relation to the electron beam trajectory. This may allow directing the gas at a relatively small area that includes the electron beam area of incidence.

When the electron beam is perpendicular to the sample these small positive and negative angles in relation to said trajectory are actually greater then or smaller than ninety degrees in relation to the sample. In other words, the first portion 130 is directed towards the substrate at a first angle that is slightly smaller than ninety degrees and whereas the second portion 132 is directed towards the substrate at a second angle that is slightly larger than ninety degrees. The first angle ranges between 60–89 degrees and wherein the second angle ranges between 91 and 120 degrees.

FIG. 2 illustrates in further details gas conduit 100 (Also termed as apparatus 100) for directing gas towards a specimen, such as wafer 60.

Apparatus 100 includes: (i) A first gas conduit portion 140 oriented at a first positive angle in relation to an imaginary axis 111 substantially perpendicular to the central gas conduit portion, (ii) a second gas conduit portion 142 oriented at a second negative angle in relation to the imaginary axis 111; and (iii) a central gas conduit portion 144.

The central gas conduit portion 144 is connected between the first and second gas conduit portions 140 and 142, it defines a first aperture 120 and a second aperture 122 and it is shaped such as to allow gas to exit via the second aperture 122 at multiple directions towards a specimen and such as to induce a substantially rotationally symmetrical magnetic field at a vicinity of the space.

The first and second apertures 120 and 122 define a passage 150 that is oriented in relation to the central gas conduit portion 144. The passage 150 may be parallel to the imaginary axis 111 and is usually shaped such as to allow the passage of the primary electron beam 22.

The second portion 142 receives gas from the central gas conduit portion 144 and returns at least a portion of said received gas to the central gas conduit portion.

Figure 4:
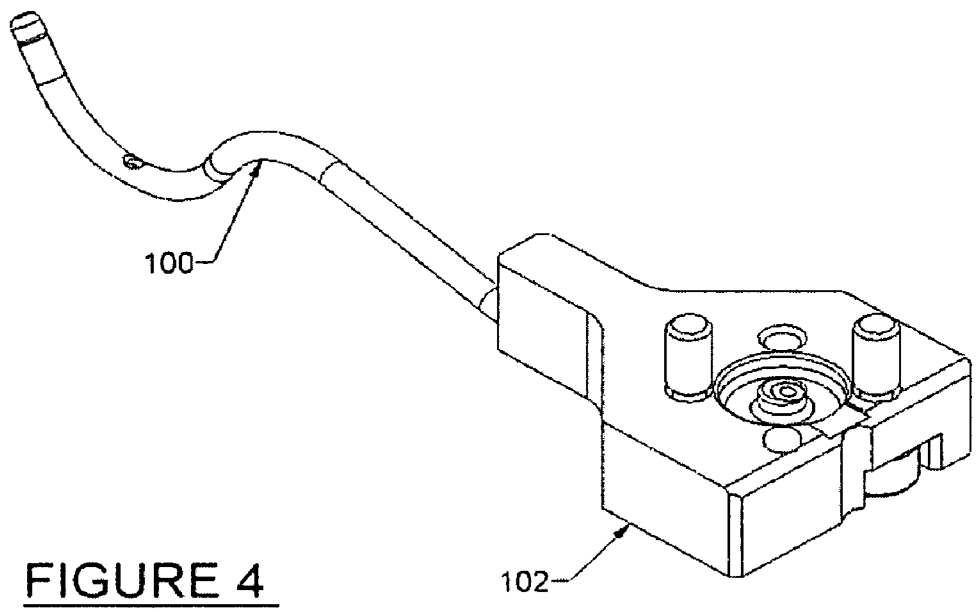
Figure 5:
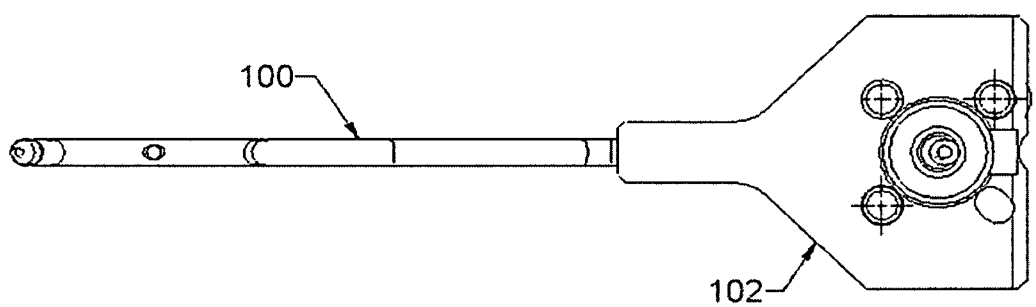
Figure 6:
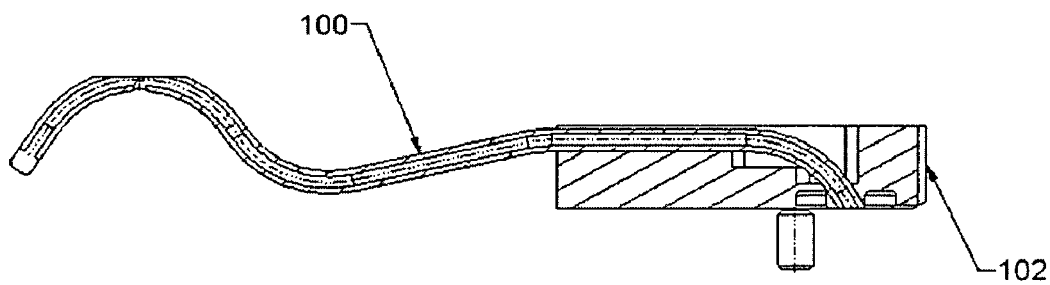
Figure 7:
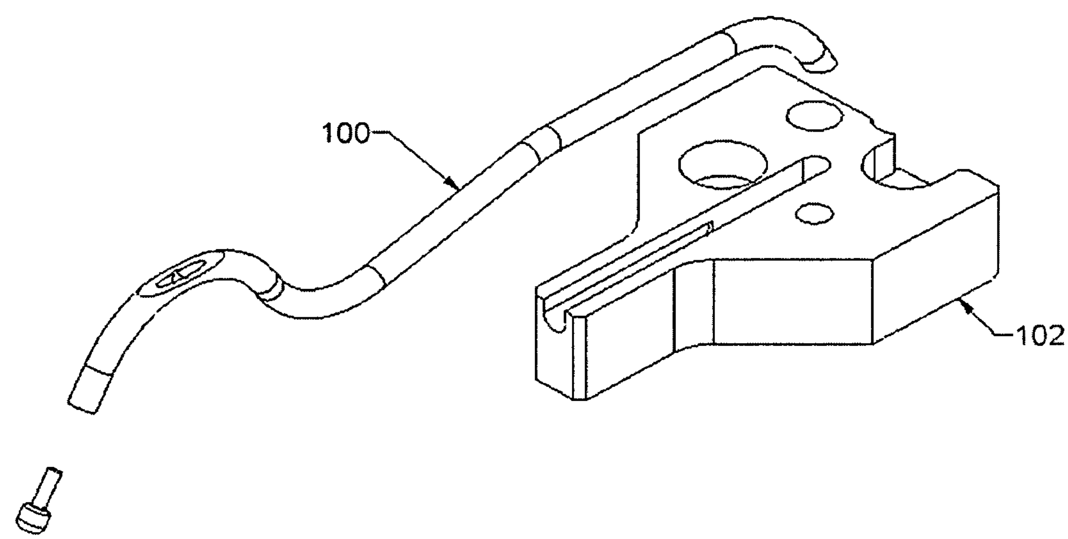

FIG. 4 illustrates gas conduit 100 as well as a base 102 connected to the gas conduit, for supplying gas to the gas conduit 100. Base 102 is a relatively large metallic object and can be connected to a heating coil, thus allowing heating of the gas conduit 100 to a desired temperature.

Figure 3:
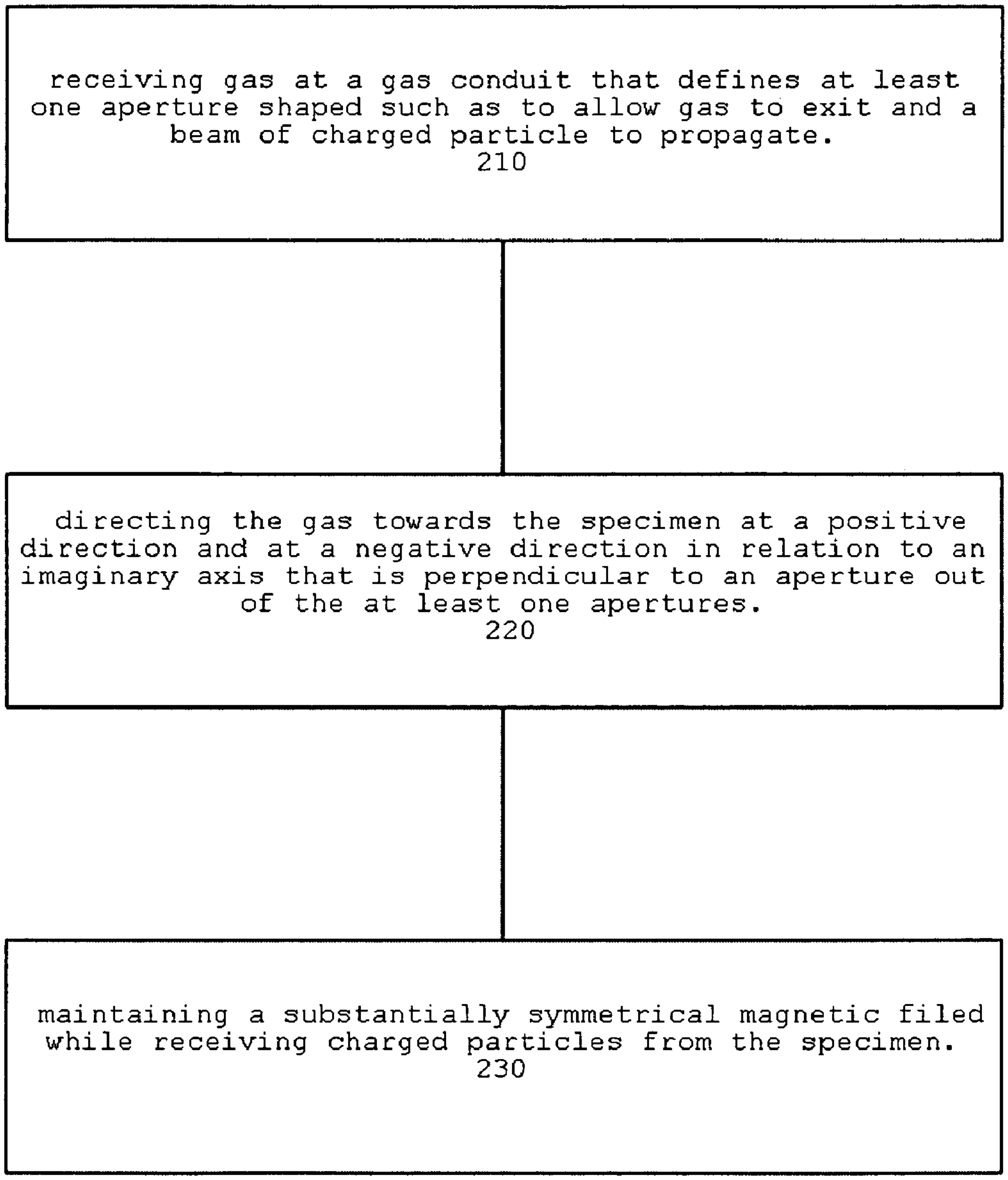
FIG. 3 is a flow chart illustrating a method for providing gas, according to an aspect of the invention.

FIG. 3 illustrates method 200 for directing gas towards a specimen. Method 200 starts by stage 210 of receiving gas at a gas conduit that defines at least one aperture shaped such as to allow gas to exit and a beam of charged particle to propagate. Stage 210 is followed by stage 220 of directing the gas towards the specimen at a positive direction and at a negative direction in relation to an imaginary axis that is perpendicular to an aperture out of the at least one apertures. Stage 220 is followed by stage 230 of maintaining a substantially symmetrical magnetic filed while receiving charged particles from the specimen.

It is noted that the system and apparatus and method are well suited to direct gas towards a tilted sample, although this may affect a possible symmetry in the gas distribution.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein. For example, FIGS. 4–7 illustrate a gas nozzle 100 having a heat sink 102.

Only exemplary embodiments of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A system for directing gas towards a specimen, said apparatus comprising:

means for directing a beam of charged particles towards the specimen; and a gas conduit providing gas to an area of incidence of said beam of charged particles onto said specimen; whereas the gas conduit comprising:

an intermediate portion having a first end for receiving the inert gas and a substantially sealed second end;

whereas the intermediate portion has an first and second apertures that are positioned such as to define a space through which the beam of charged particles can propagate; and whereas the intermediate portion is shaped such as to allow a first portion of the inert gas to exit the second aperture and to allow a second portion of the gas to propagate towards the second end and to be returned through the second aperture.

2. The system according to claim 1, wherein the first portion and the second portion of the gas exit the second aperture at substantially opposite directions.

3. The system of claim 1 wherein the first portion and the second portion of gas form a symmetrical gas distribution pattern in relation to an optical axis of the beam of charged particles.

4. The system according to claim 1, wherein the gas conduit generates a substantially rotational symmetrical magnetic field at the vicinity of the apertures.

5. The system according to claim 1 whereas the intermediate portion is U-shaped.

6. The system of claim 1 wherein the first and second system are positioned at substantially a middle of the intermediate portion.

7. The system of claim 1 wherein the intermediate portion is saddle shaped.

8. The system of claim 1 wherein the second aperture is larger than the first aperture.

9. The system of claim 1 where the first and second apertures have substantially symmetrical shapes.

10. The system of claim 1 wherein the intermediate portion is shaped such as to prevent substantial beam deflection due to charging of the intermediate portion from interactions with charged particles returning from the specimen.

11. The system of claim 1 wherein the intermediate portion has a substantially symmetrical portion that defines the apertures.

12. The system of claim 11 wherein the substantial symmetrical portion is sized and positioned such as to interact with most of the charged particles returning from the specimen.

13. The system of claim 11 wherein the substantially symmetrical portion is at least 1 mm long.

14. The system of claim 1 wherein the first portion is directed towards the substrate at a first angle that is slightly smaller than ninety degrees and whereas the second portion is directed towards the substrate at a second angle that is slightly larger than ninety degrees.

15. The system of claim 12 wherein the first angle ranges between 60–89 degrees and wherein the second angle ranges between 91 and 120 degrees.

16. An apparatus for directing gas towards a specimen, said apparatus comprising:

a first gas conduit portion oriented at a first positive angle in relation to an imaginary axis that is perpendicular to a central gas conduit portion;

a second gas conduit portion oriented at a second negative angle in relation to the imaginary axis;

a central gas conduit portion, coupled to the first and second gas conduit portions, the central gas conduit portion defines a first aperture and a second aperture; whereas the central gas conduit portion is shaped such as to allow gas to exit via the second aperture at multiple directions; whereas the first and second apertures define a passage; and whereas the central gas conduit is shaped such as to induce a substantially rotationally symmetrical magnetic field at a vicinity of the space.

17. The apparatus of claim 16 wherein the passage is shaped such as to allow the passage of a beam of charged particle beam.

18. The apparatus of claim 17 wherein the second gas conduit receives gas from the central gas conduit portion and returns at least a portion of said received gas to the central gas conduit portion.

19. The apparatus of claim 17 wherein the second gas conduit receives gas from the means for providing gas.

20. The apparatus of claim 17 wherein the first and second apertures define a space through which a beam of charged particles can propagate.

21. The apparatus according to claim 17, wherein the gas exits the second aperture at substantially opposite directions.

22. The apparatus of claim 17 wherein the gas exits the second aperture to form a symmetrical gas distribution pattern.

23. The apparatus according to claim 17, wherein the central gas conduit portion generates a substantially rotational symmetrical magnetic field at the vicinity of the apertures.

24. The apparatus according to claim 17 whereas the first, second and central gas conduit portions form a U.

25. The apparatus of claim 17 wherein the second aperture is larger than the first aperture.

26. The apparatus of claim 17 where the first and second apertures have substantially symmetrical shapes.

27. A method of directing gas towards a specimen, the method comprises the stages of:

receiving gas at a gas conduit that defines at least one aperture shaped such as to allow gas to exit and a beam of charged particle to propagate;

directing the gas towards the specimen at a positive direction and at a negative direction in relation to an imaginary axis that is perpendicular to an aperture out of the at least one apertures; and maintaining a substantially symmetrical magnetic filed while receiving charged particles from the specimen.

28. The method of claim 27 further comprising a stage of interacting at least a portion of the gas with a beam of charged particles directed toward the specimen.

29. The method of claim 28 wherein the interaction results in milling the specimen.

30. The method of claim 28 wherein the interaction results in imaging the specimen.

31. The method of claim 28 whereas the charged particles are electrons.

32. The method of claim 28 whereas the charged particles are ions.

33. The method of claim 28 wherein the stage of directing the gas partially overlaps with a stage of directing a beam of charged particles towards the specimen.

34. The method of claim 28 wherein the stage of directing the gas does not overlaps with a stage of directing a beam of charged particles towards the specimen.

35. The method of claim 28 wherein the stage of directing comprises: directing received gas towards a second aperture; whereas a first portion of the gas exits via the second aperture while another portion propagates through a portion of the gas conduit to be retuned to the second aperture.

* * * * *